US008120996B2

(12) United States Patent
Noehte et al.

(10) Patent No.: US 8,120,996 B2
(45) Date of Patent: Feb. 21, 2012

(54) DEVICE AND METHOD FOR MICROSTRUCTURING A STORAGE MEDIUM AND STORAGE MEDIUM COMPRISING A MICROSTRUCTURED REGION

(75) Inventors: Steffen Noehte, Weinheim (DE); Robert Thomann, Heidelberg (DE)

(73) Assignee: Tesa Scribos GmbH, Heidelberg (DE)

( * ) Notice: Subject to any disclaimer, the term of this patent is extended or adjusted under 35 U.S.C. 154(b) by 648 days.

(21) Appl. No.: 12/295,695

(22) PCT Filed: Apr. 4, 2007

(86) PCT No.: PCT/EP2007/053328
§ 371 (c)(1),
(2), (4) Date: Nov. 14, 2008

(87) PCT Pub. No.: WO2007/116000
PCT Pub. Date: Oct. 18, 2007

(65) Prior Publication Data
US 2009/0180360 A1 Jul. 16, 2009

(30) Foreign Application Priority Data
Apr. 4, 2006 (DE) .......................... 10 2006 015 609

(51) Int. Cl.
*G11B 11/00* (2006.01)
(52) U.S. Cl. .............................. 369/13.02; 430/1; 359/2
(58) Field of Classification Search ............... 369/13.02; 355/77; 430/311, 322, 5, 1, 2; 250/492.2, 250/492.22; 347/239; 359/2, 9, 10, 35
See application file for complete search history.

(56) References Cited

U.S. PATENT DOCUMENTS

| 4,826,299 | A | 5/1989 | Powell ........................... 350/432 |
| 5,136,149 | A | 8/1992 | Fujiwara et al. ............ 250/201.5 |
| 6,177,980 | B1 | 1/2001 | Johnson .......................... 355/67 |
| 6,414,326 | B1 | 7/2002 | Nguyen ...................... 250/492.2 |
| 6,451,507 | B1 | 9/2002 | Suenaga et al. ............... 430/311 |
| 6,552,830 | B2 | 4/2003 | Long ................................. 359/2 |
| 7,028,464 | B2 | 4/2006 | Rösel et al. ..................... 60/285 |
| 7,384,709 | B2 | 6/2008 | Noehte et al. ..................... 430/1 |

(Continued)

FOREIGN PATENT DOCUMENTS
DE 35 12 615 10/1986
(Continued)

OTHER PUBLICATIONS
International Search Report for PCT/EP2007/053328.
(Continued)

*Primary Examiner* — Ali Neyzari
(74) *Attorney, Agent, or Firm* — Proskauer Rose LLP

(57) ABSTRACT

A device providing for microstructuring a storage medium includes a radiation source for producing an at least partially coherent beam from electromagnetic radiation, a modulator provided with a plurality of individually switchable modulator elements, a beam-forming optical element for illuminating the modulator, a reducing optical element for reducing a beam radiated by the modulator, and a transport table for displacing the storage medium in relation to the reducing optical element. The device solves technical problems caused by writing of microstructuring and individual diffractive optical elements, in particular computer-generated holograms having a high speed and high writing energy. The device is achieved in that the reducing optical element is configured with limited diffraction and produces a surface reduction of at least 25 from a surface of the individually switchable modulator elements.

21 Claims, 8 Drawing Sheets

U.S. PATENT DOCUMENTS

| | | | |
|---|---|---|---|
| 7,413,830 B2 | 8/2008 | Noehte et al. | 430/1 |
| 7,618,751 B2 * | 11/2009 | Sandstrom et al. | 430/5 |
| 2004/0114217 A1 | 6/2004 | Mann et al. | 359/366 |
| 2004/0136040 A1 | 7/2004 | Noehte et al. | 359/35 |
| 2004/0257629 A1 | 12/2004 | Noehte et al. | 359/35 |
| 2005/0219502 A1 | 10/2005 | Sandstrom et al. | 355/77 |
| 2006/0206851 A1 | 9/2006 | Van Wingerden et al. | 716/19 |

FOREIGN PATENT DOCUMENTS

| | | |
|---|---|---|
| DE | 198 02 712 | 8/1999 |
| DE | 199 39 088 | 2/2000 |
| DE | 101 37 832 | 12/2002 |
| EP | 0 453 946 | 4/1991 |
| EP | 1 094 352 | 4/2001 |
| EP | 1 202 550 | 5/2002 |
| EP | 1 480 441 | 11/2004 |
| WO | 01/79935 | 10/2001 |
| WO | 02/079881 | 10/2002 |
| WO | 02/079883 | 10/2002 |
| WO | 02/084404 | 10/2002 |
| WO | 02/084405 | 10/2002 |
| WO | 02/084588 | 10/2002 |
| WO | 03/012549 | 2/2003 |
| WO | 03/016977 | 2/2003 |
| WO | 2004/059394 | 7/2004 |
| WO | 2005/111913 | 11/2005 |

OTHER PUBLICATIONS

Thomann, R.C., et al., "Vibration Non-Sensitive Lithographic System for Writing Individualized Holograms for Data Storage and Security Applications," Emerging Lithographic Technologies IX, Proceedings of SPIE vol. 5751, 2005, pp. 619-628.

* cited by examiner

DEVICE AND METHOD FOR MICROSTRUCTURING A STORAGE MEDIUM AND STORAGE MEDIUM COMPRISING A MICROSTRUCTURED REGION

CROSS-REFERENCE TO RELATED APPLICATIONS

This application is a National Phase Application of International Application No. PCT/EP2007/053328, filed on Apr. 4, 2007, which claims the benefit of and priority to German Patent Application No. DE 10 2006 015 609.9, filed on Apr. 4, 2006. The disclosure of the above applications are incorporated herein by reference in their entirety.

FIELD OF THE INVENTION

The invention relates to a device and a method for microstructuring a storage medium and a storage medium comprising a microstructured region. The invention likewise relates to a device and a method for autofocusing an imaging optical unit of a writing device for microstructuring a storage medium. Furthermore, the invention relates to a novel writing strategy for producing a microstructuring on a storage medium.

BACKGROUND OF THE INVENTION

Microstructurings comprise a plurality of dots and/or lines that are used to alter an optical property of a surface or of one or more layers of a storage medium. A change in reflectivity, transmission, absorption, scattering behavior, phase of the reflected light or a combination of all the effects can be achieved through microstructurings. In this case, the spatial resolution may be less than 10 μm down to dot or line dimensions of less than 1 μm. Microstructurings of this type are used for storing information; and in particular, computer-generated holograms, microimages or microscripts can be produced thereby.

Computer-generated holograms comprise one or more layers of dot matrices or dot distributions which, in the event of illumination with a preferably coherent light beam, lead to a reconstruction of items of information coded in the hologram. In this case, the dot distribution may be calculated as an amplitude hologram, phase hologram or as a kinoform Fresnell or Fourier hologram. In order to produce computer-generated holograms, the holograms are first calculated and subsequently written to a storage medium by a suitable writing device by means of dotwise introduction of energy. The resolution of the dot matrix that arises may lie within the range down to less than 1 μm, as already discussed. Consequently, holograms having a high resolution can be written in a confined space, the information of which holograms can only be read out by illumination with a light beam and reconstruction of a diffraction pattern. In this case, the size of the holograms may be between a few square millimeters and multiple square centimeters.

A major advantage of the computer-generated holograms is that each hologram can be calculated individually without a high outlay. Consequently, holograms comprising consecutive numbers or production parameters, for example, can be generated in series. Holograms of this type can therefore be used in particular as security features or in logistics for product tracking on packaging, credit cards, entrance tickets or the like. By a suitable read-out device, the security features of the hologram can be read out and the authenticity and individuality of the security feature can be checked in a simple manner.

The computer-generated holograms described above can be combined with a directly visible item of information (i.e. microscripts and microimages). In addition, with a microstructuring mentioned in the introduction, the above-mentioned microimages and microscripts themselves can also be written independently of computer-generated holograms. The dot distributions can also be produced as dot matrix holograms, wherein in each case individual small area portions are produced as different diffraction structures of the dot matrix hologram. In addition, it is also possible to produce a diffractive optical element (DOE) per se with the microstructuring.

When writing or read-out by a light beam as described below, a laser beam in the visible wavelength range is generally preferred. Nevertheless, the present invention is not restricted to the application of visible light. In principle, the invention can be applied with electromagnetic radiation in a wide wavelength range.

The prior art furthermore discloses a plurality of writing devices for writing computer-generated holograms which write the optical structures of the holograms in planar storage media. By way of example, reference is made in this respect to documents WO 02/079881, WO 02/079883, WO 02/084404, WO 02/084405 and WO 03/012549. These writing devices use a laser beam that successively scans each individual dot of the dot matrix and each may or may not introduce light energy into the storage medium.

A plurality of reading devices are likewise known which are suitable, by illuminating the hologram area by a light beam and a suitable optical unit, for making the reconstruction visible or electronically representable by recording means and evaluable. By way of example, in this context, reference is made to documents DE 101 37 832, WO 02/084588 and WO 2005/111913.

By contrast, EP 1 094 352 A2 discloses an optical writing device for image generation with a light source comprising a plurality of laser diodes arranged in a series. The light emitted by said light source is directed, by an optical unit, onto a grating light valve (GLV) from Silicon Licht Machines, by which a diffraction takes place for each point of the GLV. The GLV can also be referred to as a line light modulator. An image arises line by line as a result of progressive exposure. The resolution in the written image that is generated by the writing device is specified as 2400 dpi corresponding to a dot size of about 10 μm.

DE 198 02 712 A1 discloses a device for exposure of a computer-generated hologram on a storage medium. A conditioned laser beam impinges on a digital light processor (DLP), by which a 2D light field is deflected onto the storage medium. Structures are produced in a storage medium by small-area individual mirrors of the DLP. The hologram size is therefore determined by the DLP used and a scaling of the imaging.

EP 1 202 550 A1 shows a writing device comprising a line light modulator (GLV) and comprising an imaging optical unit. A polarizer is arranged in-a beam path of a laser beam, said polarizer producing a linear polarization of the beam. The preferred direction of the line light modulator is utilized as a result, such that high intensities are achieved on a writing medium. A writing of photosensitive and heat-sensitive materials is thus accelerated.

EP 1 480 441 A1 shows a construction of a writing device comprising a beam multiplier that generates a multiplicity of individual beams from a single-mode laser beam. Said individual beams then impinge on a multichannel spatial light modulator and are individually modulated there. The individual beams reflected by the SLM are each substantially single-mode beams and a downstream optical unit images this plurality of individual beams onto a surface of a light-sensitive workpiece. The method described serves for example to produce circuits.

WO 01/79935 discloses a device which can be used to produce photomasks for semiconductor elements and display devices. Semiconductor elements, displays, integrated optical elements and electronic connecting structures can likewise be written directly. In order to produce individual dots, a spatial light modulator (SLM) is in a beam path of a laser beam. A downstream imaging optical unit then images a light modulator on a storage medium in order to write a structure. In order to control an energy fluctuation between individual writing pulses and thus to enable the structure to be written uniformly, it is proposed to use a very fast control of a switch that enables the light energy to be switched off actually during a laser pulse. In this case, WO 01/79935 takes an average writing power of 10-100 mW as a basis.

The systems described above each has at least one of the following problems, such as an excessively low spatial resolution and low accuracy of the written structuring, an excessively low throughput or writing speed, no individually producible structures or an excessively low writing energy to allow the structuring of materials that are not very photosensitive or heat-sensitive.

Systems of the type described above require for operation in progress an active autofocusing in order to correct relative deviations between the imaging optical unit and the storage medium. In this case, one problem for a very accurate and quickly operating autofocus system is that the structuring of a storage material with a resolution in the range of the wavelength or with a corresponding numerical aperture(NA) necessitates an active height regulation. This results from the limited depth of field, which is related to the NA used as follows:

$$\Delta z = 0.8 \frac{\lambda}{NA^2}.$$

It can be seen here that as NA increases, which means smaller structures, the depth of field Δz decreases reciprocally to the square of NA. For structures in the visible wavelength range and given structure sizes of about 1 μm, a depth of field in the single-digit micrometer range is thus calculated. On account of manufacturing tolerances of the storage medium or on account of inaccuracies as a result of the mounting of the storage medium, a height variation of the storage material in the two-digital micrometer range should be expected. This necessitates an active height regulation.

The requirement made of the height regulation consists in keeping the writing beam within the depth of field over its entire region. In the case of systems known from the prior art it was assumed that the height changes are little within the exposure width or region and a one-point height regulation is thus sufficient. However, experiments have repeatedly shown that unstructured locations, particularly at the edge of the exposure, occur on account of inaccuracies in manufacturing and as a result of misalignment of the sample or storage material mounting. This results in the requirement for a height regulation over the entire exposure region which becomes all the more urgent, the larger the exposure region becomes.

SUMMARY OF THE INVENTION

In one aspect, the present invention is related to writing microstructurings and individual diffractive optical elements (DOE), in particular computer-generated holograms, at high speed, with high precision and with a high writing energy.

Another aspect of the present invention relates to specifying a system which can be used to write dot or line structures having a structure size in the micrometer range (50 μm to 1 μm) or in the submicron range (1.0 μm to 0.01 μm).

A further aspect of the present invention relates to specifying a system which can be used to write dot or line structures at high speed (typically 100 Mdots/s or higher).

A further aspect of the present invention relates to specifying a system which can be used to write large-area microstructurings in the range of 1 mm² to 1 m², typically 1 cm².

A further aspect of the present invention relates to specifying a system which can be used to write microstructurings to a material that is optically not very sensitive to light or heat (e.g. thin aluminum layers, metals, polymers, and rare earths).

In an embodiment, a device for writing microstructurings includes:
  a radiation source for generating an at least partly coherent beam of electromagnetic radiation,
  a modulator having a plurality of individually switchable modulator elements,
  a beam shaping optical unit for illuminating the modulator,
  a reducing optical unit for reducing a beam emitted by the modulator,
  an arrangement for converting a phase modulation into an intensity modulation, for example by a spatial frequency filter, and
  a transport device, in particular a transport table or a transport belt, for moving a storage medium relative to the reducing optical unit.

The device is exemplified below on the basis of a transport table, but this embodiment is not intended to restrict the invention to this specific embodiment. A transport belt or any other suitable transport device is for example also possible in application.

In one embodiment in accordance with the invention, the reducing optical unit is formed in diffraction-limited fashion, and the reducing optical unit produces an area reduction of at least 25 proceeding from an area of the individual modulator elements.

By the beam shaping optical unit, the individually switchable modulator elements are in each case irradiated with a plane wave or a substantially plane wave, such that an optimum result, i.e. very small diameters of individual reduced dots are achieved by the diffraction-limited reducing optical unit. For a delimitation of the lack of planarity of a wave it is possible to employ the Rayleigh criterion, which states that across each modulator element the deviation from the plane wave is not greater than □/4 where □ is the wavelength of the light.

Owing to the use of a modulator operating in parallel, for example a line light modulator, a multiplicity of individual dots or lines of an individual structure can be written to the storage medium in one exposure step. In this case, the diffraction-limited reducing optical unit and the great reduction associated therewith afford the possibility of being able to write very small structures with a high writing energy. This enables fast and massively parallel writing of microstructurings to materials which previously cannot be written to. Owing to the reduction of typically 250 or at least 25 and diffraction-limited beam guiding, high energy densities that would otherwise destroy the modulator itself can be controlled with the modulator.

In another embodiment, without a downstream development step, DOE, in particular computer-generated holograms, can thus be produced rapidly and cost-effectively, and they can additionally be produced individually and in the micrometer or submicron range. The writing speed can reach as much as 100 Mdots/sec, for example. A further advantage is that a high positioning accuracy of the diffractive exposure points can be achieved. Finally, the microstructuring can also be written with a different intensity, i.e. for example with different gray shades, by a suitable driving of the modulator.

The term diffraction monitoring is described according to DIN ISO 10110-5 as follows. A measure of the imaging quality of a system is the "Strehl definition brightness" or the "Strehl intensity ratio", i.e. the ratio of the intensity in the center of the point image to what is defined for the aberration-free optical system. This ratio states how much light in comparison with the theoretically possible light is combined in the diffraction disk, also called Airy disk, and how much light is situated outside. A Strehl value of 1 corresponding to 100% means that the light present within the diffraction disk reaches the theoretically maximum value. Such a system would be free of imaging aberrations. Optical units having a Strehl value of better than 0.8 are deemed to be diffraction-limited according to this standard.

The measure according to Strehl is directed toward measuring the intensity distribution at the focus relative to the diffraction disk. There is a further possibility for determining the diffraction limitation, which relates, however, to the form or to the dimension of the diffraction disk. In this respect there exists the formula $$d = \lambda/NA$$

wherein d is the diameter of the diffraction disk measured as the distance between the diffraction minima on both sides of the diffraction disk, $\lambda$ is the wavelength of the focused light, and NA is the numerical aperture of the reducing. optical unit.

If the dimension of the diffraction disk deviates by less than 20% from this value d according to the abovementioned formula toward larger values, then the optical unit used is diffraction-limited.

In another embodiment, it is furthermore preferred for the area reduction of the reducing optical unit to be between 25 and 1000, preferably between 50 and 1000, in particular 250. In this value range it is possible to produce particularly small and intensive light structures or light spots line by line or areally which can enable even less light-sensitive materials to be altered sufficiently to produce a microstructuring. Examples of such materials include thin aluminum layers, metals, polymers, and rare earths, in which restructurings, displacement processes, condensation processes, ablation processes or evaporation processes are initiated by point wise introduction of energy.

In a further preferred embodiment, the reducing optical unit reduces the radiation intensity diffracted by each modulator element to a size of less than 10 μm diameter, in particular less than 1 μm diameter. As a result it is possible to produce microstructures with a resolution which have hitherto been unattainable particularly in the case of less photosensitive materials.

In another embodiment of the invention, the radiation source is advantageously formed as a laser. However, this configuration of the light source does not represent a restriction of the invention. It is already apparent from the prior art, however, that the laser is the preferred means for generating an at least partly coherent beam of electromagnetic radiation. A pulsed laser is preferably used, the pulses of which have a higher energy density than the laser beam of a continuous wave laser.

Typically a pulsed laser has such characteristics that the pulse durations are in the nanosecond range and that the energy of a pulse is in the region of 100 microjoules. This means, given 1024 points of a line light modulator, an energy per pulse and modulator element of about 0.1 microjoule. This results in a sufficient energy density for material structuring which depends only to a small extent on the thermal conductivity of the material.

An embodiment of producing microstructurings is therefore realized optimally if high-energy laser pulses in the visible or adjacent wavelength ranges are used to microstructure the storage medium. This results in a broader variety of usable materials. The use of a cw laser is possible in principle, but is not as advantageous owing to the lower energy density than other lasers.

Furthermore, it is preferred for the laser to generate a monomode laser beam, such that, on the one hand, the coherence properties of the light beam are optimal and, on the other hand, a regular intensity distribution of the laser beam transversely with respect to the propagation direction is present.

By contrast, it may also be sufficient for the laser to generate a multimode laser beam with partial coherence. Even if the intensity distribution of the laser beam generated is not optimal and possibly has to be compensated for, it is sufficient if the beam directed onto the modulator has a spatial coherence extending at least across some of the individually switchable modulator elements. It is therefore not of importance for all the individually switchable modulator elements to be irradiated with mutually coherent light.

A diode-pumped solid-state laser in the visible spectral range is an example of a pulsed laser system.

An essential element for generating an intensity-modulated beam is the modulator. The individually switchable modulator elements can be controlled electronically so as to adopt at least in each case one of two possible settings. Generally, the modulator is switchable in a continuously variable manner and acts as a spatial phase modulator. Single-line or else two-dimensional modulators can be used in this case. The two-dimensional modulators have the disadvantage, however, that a two-dimensional illumination of the area of the modulator is necessary, which is more difficult than a one-dimensional illumination. A further disadvantage of two-dimensional modulators is that interference effects are manifested to a greater extent in two-dimensional exposure in the case of specific constructions of the storage media. Consequently, it is a simplification of the system if a single-line construction is chosen and a homogenization of the beam intensity is necessary only in one dimension.

In one embodiment, a single-line line light modulator comprising separately (i.e. individually) switchable modulator elements is preferred. If said single-line line light modulator is successively driven in stepwise fashion such that a different intensity distribution is produced after each new setting, then different microstructuring lines can be successively written to the storage medium. This gives rise to an area or a region with a microstructuring which can be configured individually. This is achieved because the light modulator has to be driven anew for each writing operation, which allows it to be driven differently for each writing operation.

In another embodiment, the line structure of the area light modulator is preferably imaged onto the storage medium perpendicular to the scanning movement, in order to achieve a maximum width of the written strip. A modified embodiment provides a non-orthogonal orientation, which makes it possible to obtain a finer resolution although with a reduced writing width.

One example of a single-line light modulator is a grating light valve (GLV) from Silicon Light Machines, Calif., USA. This line light modulator has separately switchable diffraction gratings. Each modulator element has a plurality of ribbons which run parallel to one another and are arranged in one plane, and of which for example every second ribbon can be adjusted electrostatically out of the plane. Consequently, the modulator element acts either as a mirror or as a small diffraction grating that diffracts the light intensity in a direction that deviates from the reflection direction. As a result, each modulator element, depending on the driving, can deflect the impinging light to different extents in the reflection or diffraction direction.

The beam shaping optical unit serves for illuminating the single-line or two-dimensional light modulator. It is desired for the illumination of the modulator to be as uniform as possible in order that a homogeneous intensity distribution is achieved which, given identical driving of the individually switchable modulator elements, leads to identical writing intensities on the storage medium. To put it in general terms, the beam shaping optical unit is intended to generate a beam profile adapted to the area of the modulator from the beam profile generated by the radiation source.

In one embodiment, when a line light modulator is used, it is preferred for the beam shaping optical unit to have a Powell lens. A Powell lens is known from U.S. Pat. No. 4,826,299 and generates, from a Gaussian intensity distribution, for example, an intensity distribution substantially approximated to a rectangular form.

Consequently, a beam shaping optical unit has the function of generating from the beam profile of the light source or laser a beam profile adapted to the geometry of the line light modulator.

A further preferred embodiment consists in the reducing optical unit being a microscope objective. A conventional technology can thus be used for focusing the intensity distribution generated by the modulator onto the storage medium and for reducing it.

Preferably, in another embodiment the reducing optical unit has at least two objectives having a different focal length and/or numerical aperture. For this purpose, an interchangeable microscope objective can be used, for example, such that the objectives in light microscopes can be used without high cost expenditure of a special development. By altering the focal length or numerical aperture, the size of the individual structures or dots can be altered in a simple manner. An easy changeover between different structure sizes and pitch is then possible when an interchangeable optical unit is employed. Reference may also be made to a fast changing of the pitch. In this case, by changing the focal length of the optical unit, the pitch, i.e. the distance between the individual dots, is altered, while changing the numerical aperture alters the dot size. Therefore, the pitch and the dot size do not change in the same way when the objective is changed.

In another embodiment it is furthermore preferred for the reducing optical unit to have a spatial frequency filter. The function of the spatial frequency filter is to convert a phase modulation into an intensity modulation. In this case, the spatial frequency filter is preferably combined with the reducing optical unit, wherein the apertured diaphragm required is arranged within the reducing optical unit.

The reducing optical unit with combined spatial frequency filter therefore constitutes nothing more than arranging a filter in the form of an apertured diaphragm in the Fourier plane in order to convert the phase modulation of the modulator, in particular of the line light modulator, into an intensity modulation in the writing beam.

For transporting the storage medium relative to the reducing optical unit, the transport device is provided. It is preferred for the transport device to be formed as a transport table and to be adjustable preferably in at least one axis, in particular in two axes. The storage medium can thus be moved in any direction transversely with respect to the propagation direction of the focused light beam. The transport device can also be formed as a transport belt.

A movement of the storage medium relative to the writing head in two directions makes it possible to write a plurality of tracks of a microstructuring alongside one another and thus to be able to process large areas.

In an embodiment, the transport table preferably has a high accuracy in the position determination, but not in the movement sequence itself. Through massively parallel exposure, the speed of the movement can be correspondingly reduced since high speeds are not of importance when the storage medium is moved. A transport table with a roll drive, in particular with a position feedback system, is preferably used.

As will be explained in more detail further below, the exact position detection is used for triggering the writing process itself; i.e. that the transport table, by virtue of its movement and its exact position determination, is the means controlling the synchronization of the writing operation. In this system, therefore, the material movement triggers the laser system and causes the controller to supply the modulator with the next exposure information. In particular the accuracy primarily in large-area exposures is increased by the synchronization.

Alternatively, it is also possible for a free-running driving of the transport table to be used and for the device to be activated at predetermined times and to perform the microstructuring line by line or portion by portion.

A further preferred embodiment consists in the fact that a movable optical element, in particular a beam splitter or mirror, is provided in the beam path upstream of the reducing optical unit for the purpose of shifting the reduced intensity pattern on the storage medium. By introducing an actuator, e.g. for moving the beam splitter or the mirror, the exposure line generated by the modulator or the exposure portion can be moved relative to the storage medium.

If a movement along the direction of the material transport is realized, then a fluctuation brought about, inter alia, by a speed fluctuation of the transport table can advantageously be compensated for as a result.

If a movement transverse to the direction of the material transport is realized, this degree of freedom permits compensation of faults or inaccuracies in the material guidance. Inter alia, in the case of an areal exposure composed of the plurality of exposure lines or exposure strips, it is necessary for the exposure lines to be placed against one another in a controlled manner. By identifying the position of the preceding exposure of the storage medium, for example by a camera system described below, it is possible for the scanning device to place the tracks or strips against one another accurately. In general, any desired detection device can be used.

The detection of an edge or marking can be detected by a camera. However, owing to the restricted repetition rate of the camera, a detection of an edge during the transport movement, for example by a photodetector arrangement, may be advantageous and thus preferred.

Likewise, by a movement of the exposure line or the exposure portion transverse to the direction of movement of the storage medium, the exposure can be effected at a position predefined in the material of the storage medium. This in turn presupposes a detection of the predefined position, e.g. an embossed marking or track, for which purpose the camera system or the photodetector arrangement can again advantageously be used.

In an embodiment, the device therefore preferably has a camera system for monitoring the microstructuring, said camera system being integrated into the beam path such that it can detect the surface of the storage medium by means of a separate illumination and observe and evaluate the structuring or marking of said storage medium. For this purpose, a beam splitter is preferably provided which directs, on the one hand, the beam deflected by the modulator and, on the other hand, the light from or into the optical branch of the camera system. For further explanation, reference is made to the detailed description of the invention.

In another embodiment, the camera system can likewise be provided for monitoring a predetermined orientation or alignment relative to a predetermined or already written microstructuring or marking. It can be utilized in particular for improved stringing together of the exposure strips of a plurality of writing operations.

In various embodiments, it is preferred for a controller to be provided, which synchronizes the laser, the modulator and the transport table. The manner of synchronization by the movement of the transport table has already been discussed above, wherein the transport table, with its exact position determination, generates a trigger signal that is taken up and processed further by the controller. A free movement of the transport table is likewise possible, wherein the controller then generates, at suitable time intervals corresponding to the speed of the transport table, control signals for the driving of the laser and of the modulator and transmits them thereto. Likewise, the control system can also be used for fast data processing and transmission to the modulator or the light modulator.

In one embodiment, the controller is preferably based on two coupled computers (a control computer and a data computer). The control computer provides the user interface and supervises all non-time-critical sequences. These include allinitiation tasks, calibration routines, diagnostic tools, etc. The data computer is responsible for providing the data to be processed. The two computers communicate with one another via a connection. Time-critical functions such as the triggering of the laser and the driving of the modulator are performed by a suitable processor card. Preferably the position signal of the transport table, in particular of the X-Y linear table, is used as central clock generator of the entire lithographic system. The sequences during the exposure are controlled according to the position signal.

Another aspect in accordance with the invention relates to a method for controlling an above-described device for microstructuring a storage medium, wherein
during the movement of the transport table, a master trigger $T_0$ is generated for a predetermined time duration $\Delta T$ before the position of a new structuring to be written in the storage medium is reached,
the radiation source is driven in order to generate a radiation pulse at the instant $T_0 + \Delta T$,
the modulator is set in accordance with the information to be written, before the instant $T_0 + \Delta T$ is reached, and
the radiation source generates, at the instant $T_0 + \Delta T$, a radiation pulse whose intensity distribution is varied in accordance with the setting of the modulator.

In an embodiment, the respective microstructurings can be produced successively by the modulator or light modulator. Particularly in the case of a linear single-line light modulator, the dots of the structuring are written to the storage medium line by line at predetermined distances. In this case, uniform distances between the individual lines are primarily of importance in order to achieve a uniform arrangement of the dots or lines in a predetermined grid.

Preferably, the transport table is moved continuously, and the master triggers $T_0$ are generated by the movement of the transport table by a predetermined distance in each case. In this way, the transport table is moved continuously and not driven for individual movement steps.

Another aspect in accordance with the invention relates to a method for controlling an above-described device for microstructuring a storage medium, wherein
a first structuring track is written to the storage medium in a writing direction,
at least a second structuring track is written to the storage medium in a manner parallel to the preceding structuring track, and
the at least second structuring track is written counter to the writing direction of the preceding structuring track.

A major advantage afforded in embodiments of this method is that a large area of the storage medium has individual structuring tracks written successively to it, wherein the writing is possible with alternating writing directions without the device having to be returned to a starting position.

In one embodiment, the camera system mentioned above can preferably be used to measure the position of the first structuring track, i.e. to detect the edge of the first structuring track. Consequently, a continuous tracking of the device can be effected during the writing of the second structuring track. Likewise, as mentioned above, a photodetector arrangement can also be used.

Preferably, the transport table can be moved transversely with respect to the writing direction such that the second structuring track is written in a manner directly adjoining the edge of the first structuring track. In this case, the camera system can also be utilized in order to enable an alignment, i.e. an assignment to prestructured materials, in particular to prior structures produced by printing, embossing, partial metallizations and already existing holograms.

For tracking the position of the exposure line or the exposure portion, it is also possible for example to use the above-mentioned adjustable optical element, for example in the form of the beam splitter or mirror. With the movement of this optical element, it is possible in particular to achieve a movement transversely with respect to the direction of movement of the transport table relative to the reducing optical unit. Additionally or alternatively, the modulator can also be shifted or adjusted by a piezo-drive.

Another aspect in accordance with the invention relates to a storage medium that has been microstructured in particular by embodiments described above, comprising an optically variable layer, wherein the layer is microstructured in a predetermined region, wherein the dimension of the microstructured region is at least 10 mm at least in one direction. Preferably, the dimension is at least 50 mm. In this case, the resolution of the microstructuring can lie in the micrometer range and possibly in the submicron range.

Through embodiments described above, it is possible for the first time to write to such large areas having a resolution such that applications not possible hitherto arise.

By way of example, the microstructured region can be written in the form of a strip having a length corresponding to a multiple of the width of the strip. Consequently, the length ratio of the side edges of the microstructured region is altered, such that a strip with a plurality of items of microstructured information that can be read out and monitored for the purpose of checking authenticity can be stored for example on a security document. In this case, the length can preferably correspond to at least three times the width, preferably five times the width, in particular ten times the width.

Likewise, for the specified size of the microstructuring it is possible for the microstructured region to have at least two different information contents, wherein preferably at least one information content is a computer-generated hologram. The information content can likewise be a dot matrix hologram, a microimage or a microscript or a microcoding.

Another aspect in accordance with the invention relates to a device having:
- at least two light sources,
- at least one beam splitter for directing a light beam generated by the light sources onto an imaging optical unit,
- at least two detectors for analyzing light beams reflected by a storage medium,
- at least one beam splitter for directing a light that is reflected by the storage medium and runs through the imaging optical unit onto the at least two detectors, and
- a lens for focusing a reflected light onto the at least two detectors.

By providing at least two scanning points, it is possible, during the writing of a microstructuring, in particular by means of an exposure line, for both directions of movement of the writing operation, to detect that portion of the surface of the storage medium which has not yet been written to, with at least one scanning point. In addition or as an alternative thereto, it is possible to use at least two scanning points in order to establish not only a distance but also a tilting of the storage medium relative to the imaging optical unit.

Further configurations and advantages of the device according to the invention are presented in the detailed description of exemplary embodiments.

Another aspect in accordance with the invention relates to a method for autofocusing an imaging optical unit of a writing device for microstructuring a storage medium, wherein a distance of the imaging optical unit relative to the storage medium is regulated, wherein
- light beams are generated by at least two light sources and directed onto the imaging optical unit,
- the light beams are focused onto a surface of the storage medium at a scanning point and reflected there,
- focus error signals are generated by at least two detectors for analyzing light beams reflected by the storage medium,
- a light that is reflected by the storage medium and runs through the imaging optical unit is directed onto the at least two detectors by at least one beam splitter, in which the reflected light is focused onto the at least two detectors, and
- regulation of the distance of the imaging optical unit relative to the storage medium is carried out in a manner dependent on the focus error signal of at least one of the at least two detectors.

The method described above utilizes the at least two scanning points as previously explained. Further configurations and advantages of the method according to the invention are presented in the detailed description of exemplary embodiments.

Another aspect in accordance with the invention relates to a method for autofocusing an imaging optical unit of a writing device for microstructuring a storage medium, wherein a distance and a tilting of the imaging optical unit relative to the storage medium are regulated, wherein
- a light beam is generated by at least one light source and directed onto the imaging optical unit,
- the light beam is directed onto a surface of the storage medium and reflected there,
- the distance between the imaging optical unit and the surface of the storage medium is determined at least two points of the surface, and
- measured distances are used to determine and regulate the distance and the tilting.

The method mentioned above makes it possible to determine, during the writing operation, not only. the distance but also a possible tilting between the surface of the storage medium and the imaging optical unit, in order to carry out an active regulation. Further configurations and advantages of the method according to the invention are presented in the detailed description of exemplary embodiments.

Another aspect in accordance with the invention relates to a method for determining an operating point of a device for autofocusing an imaging optical unit of a writing device for microstructuring a storage medium, wherein the distance and/or the tilting of the imaging optical unit relative to the storage medium is regulated, wherein
- a predetermined region of the surface of the storage medium is structured with a predetermined pattern,
- along one axis the intensity and along the other axis the exposure height are altered continuously, and
- afterward the exposed region is analyzed microscopically and the operating point is defined.

The method described above makes it possible to realize a very accurate and effective calibration of writing intensity and distance regulation. Further configurations and advantages of the method according to the invention are presented in the detailed description of exemplary embodiments.

The above-described autofocusing systems and methods for adapting the distance of the storage medium from the imaging optical unit enable a sufficient tracking of the distance between the storage medium and the imaging optical unit, which is necessary on account of the intense focusing and the associated short extent of the focus along the propagation direction.

Another aspect in accordance with the invention relates to a method comprising the following steps:
- a structuring track is written to a storage medium in a writing direction line by line,
- an individual pixel is formed with a predetermined maximum intensity, and
- at least two pixels that are to be written in adjacent fashion are formed with an intensity that is less than the predetermined maximum intensity.

Further configurations are presented in the detailed description.

However, the exposure strategy is not dependent on the precise configuration of the device, but rather concerns all exposure operations in which microstructurings are introduced into a storage medium line by line or areally.

Various embodiments in accordance with the invention therefore serve for correcting so-called proximity effects that occur during the writing operation.

Preferably, for this purpose a control system is used for correcting the proximity effects during the running time together with an algorithm comprising a splitting of the line profile into a portioned component and into a differential component. The correction depth can be set depending on parameters which can be chosen in a variable manner and which can be material-specific, inter alia.

In such embodiments, a specific pulse strategy is used as a degree of freedom in the material structuring, which can preferably be set electronically, in particular in a manner dependent on whether the exposure line is oriented orthogonally or obliquely with respect to the direction of movement.

In such embodiments, the degree of structuring of individual exposure points in a scanned pattern, i.e. for example the intensity of the conversion—effected by the exposure—of the optical property of the material of the storage medium, is intended to be independent of the structuring or exposure of the surroundings.

In order to meet this requirement, so-called proximity effects can be taken into consideration in the driving of the pixels and thus in the choice of exposure intensity. Two different effects have to be assumed here in the lithographic device described above. Firstly, within an exposure line, intensity increases occur in the case of points placed alongside one another in comparison with an individual placed point; secondly, on account of heat propagation, different material properties occur depending on whether a point was placed in the vicinity shortly beforehand (microsecond). In other words, proximity effects are to be taken into account not only in the direction of the exposure line, but also in the writing direction. This second effect of temporal proximity is less dominant at low writing speeds and can generally be disregarded.

The effect of the different placement of the storage points can be compensated for by preprocessing the data to be written.

A final aspect in accordance with the invention relates to a method comprising the following steps:
 a structuring track is written to a storage medium in a writing direction line by line, and
 in each line individual pixels arranged at a distance from one another are formed, with a predetermined maximum intensity, in each exposure track.

Further configurations are presented in the detailed description.

The exposure strategy likewise consists in writing separate pixels that have no direct neighbors.

BRIEF DESCRIPTION OF THE DRAWINGS

The invention is explained in detail below on the basis of exemplary embodiments in connection with the following drawings, in which.

DETAILED DESCRIPTION OF THE INVENTION

Figure 1:
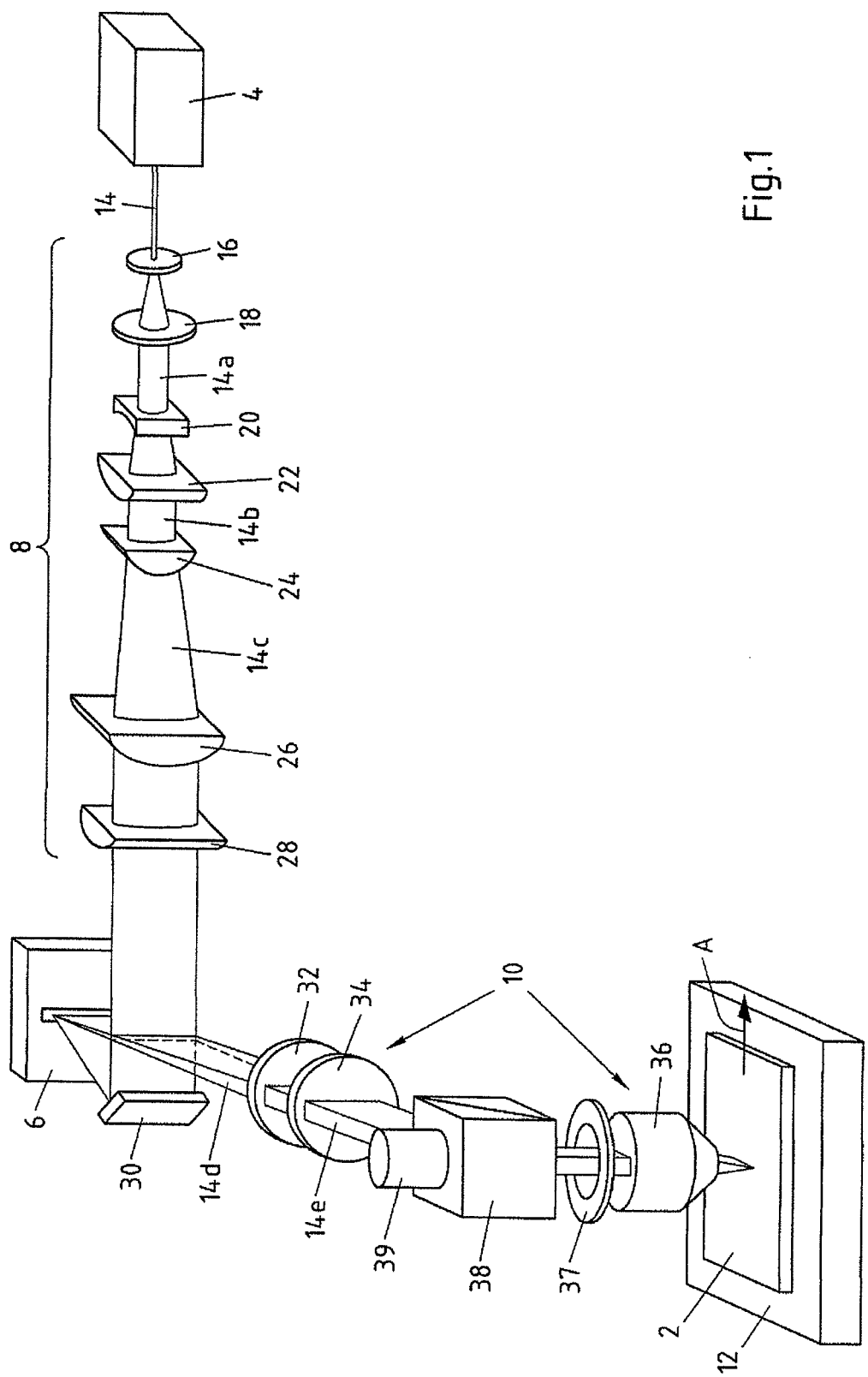
FIG. 1 shows an exemplary device in accordance with the invention for microstructuring a storage element with optical elements for generating a writing beam.

FIG. 1 shows the construction of the optical components of a device for microstructuring a storage medium 2.

A laser 4 serves as a radiation source for generating an at least partly coherent light beam 14.

A light modulator 6 is arranged in the form of a line light modulator in the beam path, said modulator having a plurality of individually switchable modulator elements.

A beam shaping optical unit, which is identified overall by the reference symbol 8, serves for illuminating the light modulator 6.

A reducing optical unit, which is identified overall by the reference symbol 10, serves for reducing the intensity distribution emitted by the light modulator 6.

A transport table 12 is provided in order to move the storage medium 2 relative to the reducing optical unit 10.

According to the invention, the reducing optical unit 10 is formed in diffraction-limited fashion, and the reducing optical unit 10 produces an area reduction of at least, preferably 50 proceeding from the area of the individually switchable modulator elements. As already described above, the range of favorable reducing factors is between 50 and 1000, in particular 250.

The reducing optical unit 10 thus reduces the radiation intensity diffracted by each modulator element to a size of less than 10 µm diameter, in particular less than 1 µm diameter. The structure sizes that can thereby be obtained on the surface of the storage medium can therefore be classified in the micrometer range down to the submicron range. Such small structurings in area sizes of up to 1 m$^2$ which can be written to by the device according to the invention lead to a multiplicity of new applications.

In the present exemplary embodiment, the laser 4 is formed as a pulsed diode-pumped solid-state laser in the visible spectral range and generates a monomode laser beam 14.

The light modulator 6 is a single-line light modulator comprising separately switchable modulator elements, said modulator also known as a grating light valve (GLV). The individually switchable modulator elements each comprises a plurality of individual strips which can be adjusted alternately from their planar arrangement by electronic driving. By corresponding electronic driving, the adjustable strips can be arranged in the plane of the non-adjustable strips in such a way that a mirroring surface arises. If the strips are adjusted, by contrast, then a modulator having an emission characteristic that deviates from the mirroring surface arises. As a result, the emission characteristic of the individually switchable modulator elements can be altered in a targeted manner and a characteristic line pattern can thus be set across the multiplicity of modulator elements. A grating light valve typically has 1000 or more modulator elements. The dimension of such a line light modulator can typically be 30 mm×25 µm, wherein the individual modulator elements have dimensions of about 25 µm in length.

The beam shaping optical unit 8 generates, from the round beam profile of the laser beam 14 with a Gaussian radial intensity distribution, a beam profile adapted to the area of the single-line light modulator.

For this purpose, the beam shaping optical unit 8 firstly has two lenses 16 and 18, which expand the laser beam 14 and which are arranged at the distance of the sum of both focal lengths from one another. In this exemplary embodiment, the focal length of the lens 16 is smaller than the focal length of the lens 18. The laser beam therefore has a larger diameter in the portion 14a of the beam path than at the output of the laser 4.

The beam path then has two cylindrical lenses 20 and 22, which generate, from the expanded rotationally symmetrical intensity distribution of the laser beam 14, an elliptical intensity distribution in the portion 14b of the beam path.

The beam shaping optical unit 8 then has a Powell lens 24, which generates a substantially rectangular intensity distribution, also referred to as flat-top, from the elliptical intensity distribution. The Powell lens 24 is known per se from the prior art, as has already been indicated in the general description. In the portion 14c of the beam path, therefore, the laser beam has a substantially uniform intensity distribution along the perpendicular direction illustrated in FIG. 1.

A collimation lens 26 generates a parallel beam bundle from the divergent beam that leaves the Powell lens 24, said beam bundle being focused by the downstream cylindrical converging lens 28. A mirror 30 directs the focused beam onto the line light modulator 6. In this exemplary embodiment, the modulator elements of the line light modulator 6 are essentially arranged in the focal plane of the converging lens 28.

As has already been explained above, one requirement made of the optical system is for each modulator element to be illuminated with a plane wave, the deviation of which from the plane wave does not exceed a maximum value of $\lambda/4$. In this exemplary embodiment, it is preferred for adjacent pixels to be irradiated with light whose plane wave properties do not deviate from one another more than $\lambda/4$. It is particularly favorable, however, if the whole light projected onto the modulator elements can be characterized as a plane wave.

Therefore, the beam shaping optical unit 8 is preferably formed in diffraction-limited fashion overall.

The reducing optical unit 10 is arranged in the beam path downstream of the line light modulator 6. For this purpose, firstly a collimation optical unit comprising two lenses 32 and 34 is provided, which generates parallel beams in the portion 14e from the individual single beams emitted by the virtually point-type modulator elements in the portion 14d. These parallel beams are then focused onto the surface of the storage medium 2 by an objective 36. The focused beam can then also be referred to as a writing beam because it introduces the writing energy required for microstructuring into the storage medium 2.

Although only one objective 36 is illustrated in FIG. 1, the reducing optical unit 10 can have at least two different objectives having different focal lengths and/or numerical apertures in order to obtain a fast changeover between dot sizes of different magnitudes during the production of the microstructuring. The objectives are preferably formed as microscope objectives.

An apertured diaphragm 37 is arranged as a further beam shaping element in the beam path upstream of the objective 36. The apertured diaphragm 37 realizes a spatial frequency filter. By means of the collimation optical unit composed of the lenses 32 and 34, the image of the modulator elements of the modulator 6 is Fourier-transformed into the Fourier plane in the region of the apertured diaphragm 37. Higher diffraction orders that arise in the Fourier plane are blocked by the apertured diaphragm 34, such that substantially only the light of the zeroth diffraction order is focused by the objective 36.

An alternative construction can be realized by virtue of the zeroth order being blocked instead of the first order, and by virtue of one of the first orders being transmitted. As a result, a higher contrast can be achieved, although at the expense of the intensity of the writing beam.

The apertured diaphragm 37 preferably has a rectangular aperture since the beam generated by the line light modulator 6 assumes a substantially rectangular form, in particular in the Fourier plane. By contrast, it is also possible to utilize an elliptical or round aperture form.

The transport table 12 illustrated below the storage medium 2 is adjustable in two axes and can therefore be moved in a plane transversely with respect to the beam propagation of the focused beam below the microscope objective 36.

In addition, the transport table 12 can move the storage medium 2 in the direction of the reducing optical unit 10 in order to enable a height adaptation. This degree of freedom is advantageous for carrying out an autofocusing, mentioned further below, in order to keep the storage medium as precisely as possible at the focus of the reducing optical unit 10.

A dichroic beam splitter 38 is arranged in the beam path between the lenses 32 and 34 of the collimation optical unit and the objective 36, and can be moved along the propagation direction of the beam 14e by means of an actuator (not illustrated). By a movement of the beam splitter 38, the focused line of exposure points can be adjusted and aligned transversely with respect to the movement of the storage medium 2, which is represented by the arrow A.

Figure 2:
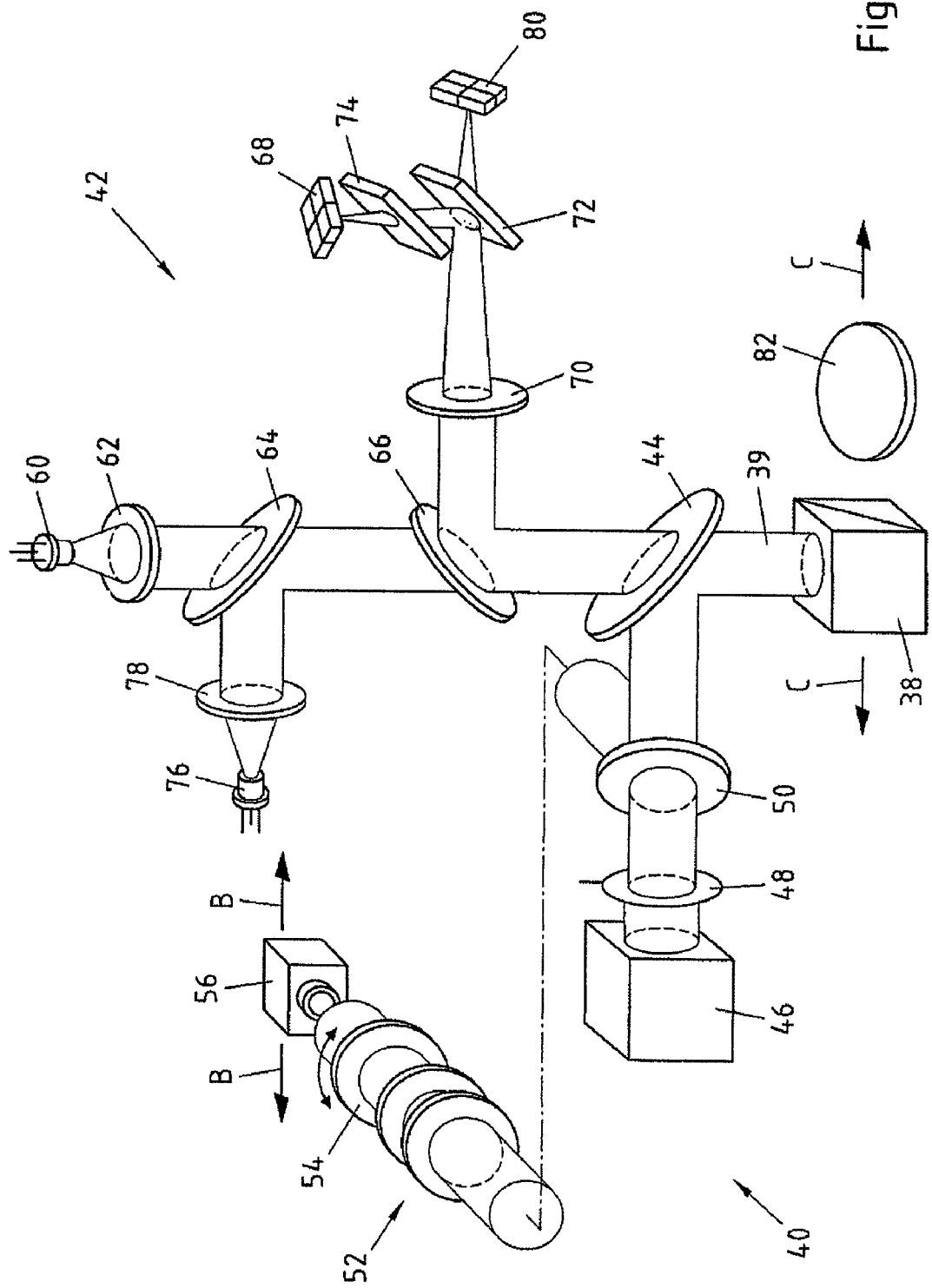
FIG. 2 shows an exemplary device in accordance with the invention for microstructuring a storage medium with the optical elements for monitoring and controlling the writing operation.

FIG. 2 shows the optical construction for monitoring and controlling the writing operation, in particular also for the alignment of the structures to be exposed with respect to already existing structures, on the storage medium 2. Firstly a camera system 40, inter alia for monitoring the microstructuring, and secondly an autofocusing system 42 are provided for this purpose.

Both systems 40 and 42 begin at the dichroic beam splitter 38 described above. Above the latter system, a further, preferably likewise dichroic beam splitter 44 is provided, which splits the two beam paths for the camera system 40, on the one hand, and the autofocusing system 42, on the other hand.

The camera system firstly has an illumination device in the form of a light source 46, which is formed as a diode lamp (LED) or as a halogen lamp. An adjustable diaphragm 48 regulates the intensity of the quantity of light radiated onto the surface of the storage medium 2. Via the beam splitter 44, the light beam is directed downward in the direction of the storage medium 2, wherein the light beam is focused by the objective 36. In this respect, reference is made to the illustration in FIG. 1, which at 39 rudimentarily shows the beam running in the direction of the camera system 40 and the autofocus system 42.

The light reflected from the surface of the storage medium 2 passes again, but in the opposite direction, through, the objective 36, the beam splitters 38 and 44 and impinges on a, preferably 50:50 acting, beam splitter 50. Proceeding from the beam splitter 50, the light beam (shown offset in FIG. 2) passes through an objective 52 and a polarizer 54 and impinges on a camera 56.

The arrows B indicate that the camera 56 can be moved transversely with respect to the propagation direction of the beam. This freedom of movement serves to be able to observe a sufficiently large region of the surface of the storage medium 2 with a sufficiently high resolution. If, by way of example, the line light modulator 6 has about 1000 modulator elements and if the imaged points on the surface of the storage medium or the written microstructure is intended to be observed with a resolution of 4 pixels in each case, then chips having a quantity of 4000 pixels in one direction are required, which are only available as special productions. By contrast, if conventional chips are used, then their quantity of pixels is insufficient, such that the resolution deficiency can be compensated for by the described movement transversely with respect to the light propagation. The region of the storage medium 2 that is to be observed is therefore scanned by the movement of the camera 56.

The camera branch 40 described above can fulfill three tasks. The camera branch 40 can be used for preliminary examination of the storage medium 2 to be exposed, can be used for a microscopic examination of the structured 30 region of the storage medium 2, and can be used for the calibration of the modulator 6, for example of the line light modulator.

The calibration of the modulator 6 is discussed in detail further below. At any rate the polarizer 54 arranged upstream of the camera 56 can serve for a continuously variable intensity attenuation during the calibration of the line light modulator.

The camera branch 40 can furthermore advantageously be used for the fast but also accurate alignment of the overall system. It is primarily possible to use the positioning of the below-described laser diodes or laser diodes for height regulation relative to the writing laser or the exposure line.

The branch of the optical construction that is arranged above the beam splitter 44 in accordance with FIG. 2 represents an autofocusing system 42 for adapting the distance of the storage medium 2 from the reducing optical unit 10.

For this purpose, a first laser diode 60 is provided, the light from which is collimated by a lens 62 and is directed through two preferably 50:50 beam splitters 64 and 66, next through the dichroic beam splitter 38 and lastly through the objective 36 onto the storage medium 2. The reflected light then passes in the opposite direction and part of the reflected light is directed through the beam splitter 66 in the direction of a 4-quadrant detector 68, wherein a focusing lens 70 and a further preferably 50:50 beam splitter 72 are provided in the further beam path. An astigmatism is produced by the coplanar plate 74, such that the signal generated by the 4-quadrant detector 68 has an item of direction information with respect to the defocusing of the light beam on the surface of the storage medium 2.

By the defocusing information, a distance deviation of the storage medium 2 from the reducing optical unit 10, i.e. from the objective 36, can be determined and the corresponding signal can be used for regulating the distance, i.e. for an autofocusing.

A second laser diode 76 with a further lens 78 and also a further 4-quadrant detector 80 are provided in parallel with the first laser diode 60 and the first 4-quadrant detector 68. The light from the second laser diode 76 is directed onto the surface of the storage medium 2 via the beam splitter 64 in the same way as the light from the first laser diode 60 and is reflected from said surface. The reflected light is then directed through the beam splitter 72, which then acts as a coplanar plate, and, provided with an astigmatism, onto the 4-quadrant detector 80, where a distance deviation of the storage medium 2 from the objective 36 can then likewise be established on the basis of the direction information of the defocusing.

The application of two laser diodes and two 4-quadrant detectors means that an autofocusing can be carried out both temporally and spatially independently of one another. In this exemplary embodiment, the construction described has the effect that a maximum number of optical components is used jointly for both beam paths and a small space requirement thus arises.

FIG. 2 also illustrates at the bottom that a mirror 82 can also be used in place of the dichroic beam splitter 38, which mirror then directs the light modulated by the line light modulator 6 onto the camera system 40 and thus enables a direct observation of the functioning of the line light modulator 6. The beam splitter 38 and mirror 82 are adjustable jointly along the direction represented by the arrow C, such that a changeover between the two operating modes is easily possible.

Figure 3:
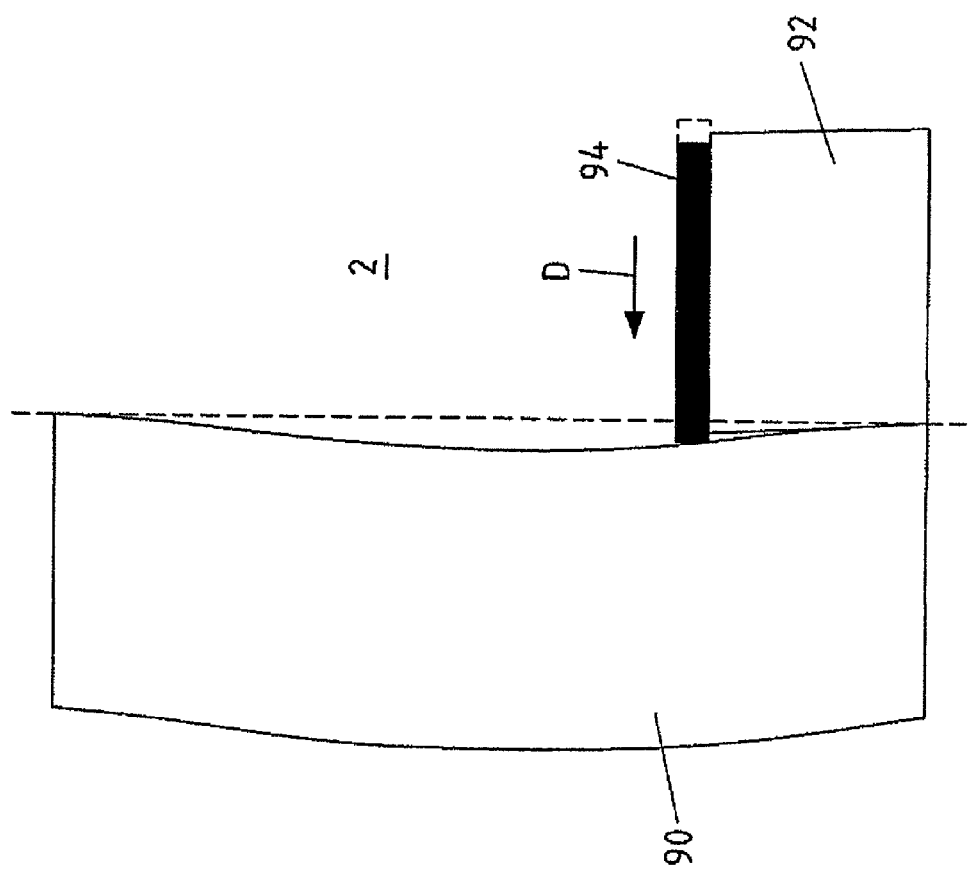
FIG. 3 shows a schematic illustration of the writing of two structuring tracks lying alongside one another.

FIG. 3 shows a schematic illustration of writing to the storage medium 2 two adjacent strips 90 and 92 with microstructurings which are intended to form for example a continuous computer-generated hologram.

As can be discerned in FIG. 3, the edge of the strip 90 deviates from the straight line illustrated in dashed fashion, the size of the deviation being exaggerated in the illustration. The strip 92 to be newly written is intended to be written as close as possible to the first strip. For this purpose, in the present exemplary embodiment, with the camera system 40 that has been described in connection with FIG. 2, the right-hand edge of the strip 90 is observed and for example the beam splitter 38 is adjusted such that the line 94 that is currently to be written is adjusted toward the left in accordance with the arrow D by a distance determined by the evaluation of the camera 15 system 40. It is thus possible for the two strips 90 and 92 to be written in a manner virtually adjoining one another.

Ultimately, it is thereby possible for a plurality of strips to be written on a relatively large area.

The function and application of the autofocus system 42—which has already been explained above with reference to FIG. 2—are described in more detail below.

The height regulation system preferably operates with a plurality of scanning points, in particular with two scanning points.

In the application of various embodiments for microstructuring, the goal of which is exposures of two or more square centimeters, an areal height regulation is particularly advantageous. The autofocusing described below is nevertheless not restricted to application explained herein and can also be applied in comparable devices.

As has already been mentioned in FIG. 2, a dichroic beam splitter 38 separates the exposure branch from the camera system 40 and from the autofocus system 42 of the optical construction.

A height regulation with a direction-dependent measurement point is preferred. For this purpose, the autofocus for finding and keeping the focus of the writing beam in the region of the storage layer of the storage medium 2 comprises an autonomous system based on the astigmatism method. In this case, an optical unit is used which has different focal lengths in two directions—which are usually at right angles to one another—transversely with respect to the light propagation direction. Thus, for the two directions at different distances with respect to the optical unit, focal planes are obtained which bring about a distortion of the beam diameter in the respective other direction. The beam cross section is round only in the region of half the path between the two focal planes. A 4-quadrant detector can then establish the extent to which and the direction in which the beam cross section picked up deviates from the round form. A reset signal can then be generated from the deviation in order to set a uniform illumination of the 4-quadrant detector.

The two laser diodes 60 and 76 illustrated in FIG. 2 serve as light sources, said laser diodes operating independently of one another and their reflected light being captured by two 4-quadrant detectors 68 and 80.

Two height regulation systems are necessary since the detection point, depending on the direction of movement 35 of the storage medium 2 relative to the writing beam, has to be situated either on the left-hand side or on the right-hand side of the exposure region. This is because a meaningful evaluation of the focus error signal is possible only in a non-structured, i.e. unexposed region of the storage medium 2. Moreover, the autofocus point is intended to be determined in a manner leading the writing operation in order to be able subsequently to correct a change in the height position of the surface of the storage medium 2.

For setting the illumination points of the two laser diodes 60 and 76, the two laser diodes are arranged such that each of the two illumination points is arranged on either side of the focus line of the focused writing beam on the surface of the storage medium 2. For this purpose, the position of the two laser diodes 60 and 76 can be set mechanically and/or electronically.

Furthermore, the two independent autofocus systems are arranged in a manner interleaved in one another in space-saving fashion and utilize a plurality of optical components in common. Primarily the branches with the 4-quadrant detectors 68 and 80 share the focus lens 70.

Instead of the two laser diodes 60 and 76 described above, it is also possible to provide further light sources in order to enable further illumination points for further autofocusing systems. For this purpose, for each light source there is correspondingly a 4-quadrant detector for measuring the deviation of the illumination point from the predetermined position. By way of example, two or three illumination points can be arranged on either side of the focused writing beam on the surface of the storage medium 2. The principle described here is therefore not restricted to two light sources.

If more than one illumination point is provided on one side of the focused writing beam, then it is thereby possible to establish not only a deviation of the height position but also a detection of the material position, e.g. height and tilting.

The above-described system with a plurality of scanning points or illumination points can also be referred to as a multipoint astigmatism height regulation system. Depending on the direction of movement of the transport table 12, different height regulation signals are then evaluated or the system changes the position of the scanning beam by an adjustment of the position of the light sources or of an optical means, such as beam splitter or mirror, arranged in the beam path.

The operating point is determined for the accurate positioning of the distance between the objective 36 and the storage medium 2. The operating point determination can be automated, particularly in the case of continuous exposures, by virtue of the diffraction efficiency of a written test structure being analyzed in temporal and spatial proximity by means of, preferably, a photodetector or a camera with varying setting of the operating point. The operating point setting for which the best, but not necessarily highest, diffraction efficiency was achieved can then be deduced by way of the location or time. Additional information can also be obtained here by evaluating higher diffraction orders. Furthermore, the operating point can be effected, preferably automatically, by the evaluation of a contrast function of the exposed structure.

If a tilting is detected by the autofocus system with at least two illumination points, i.e. for example with a two-point autofocus regulation, then a tilting correction of the storage medium can be effected during the running time by means of an actuator which tilts the diffraction grating 6 in the corresponding direction.

The spatial offset as a result of the process-dictated delay during the writing process has an effect primarily during bidirectional writing. In order to avoid an impairment of the exposed structure, an electronic offset correction can be provided. In principle, the offset correction consists in an adjustable additional delay time and/or a spatial pretrigger of the laser. This compensates for the time period that elapses between the measurement of the height position or the tilting and the writing instant, in which the storage medium is adjusted between the measurement position and the writing position. Furthermore, the tilting is likewise realized by an additional adjustable delay—here rising linearly, however, whereas it is fixed in the case of the offset compensation.

The height regulation is based on the astigmatism principle also used in CD or DVD drives. The extent and the orientation of the defocusing can be detected on the basis of the orientation of the reflected-back beam that is deformed by the astigmatism and imaged onto a 4-quadrant detector. This information serves for driving an actuator that tracks the sample or the optical system in accordance with the height profile of the storage material.

Figure 4:
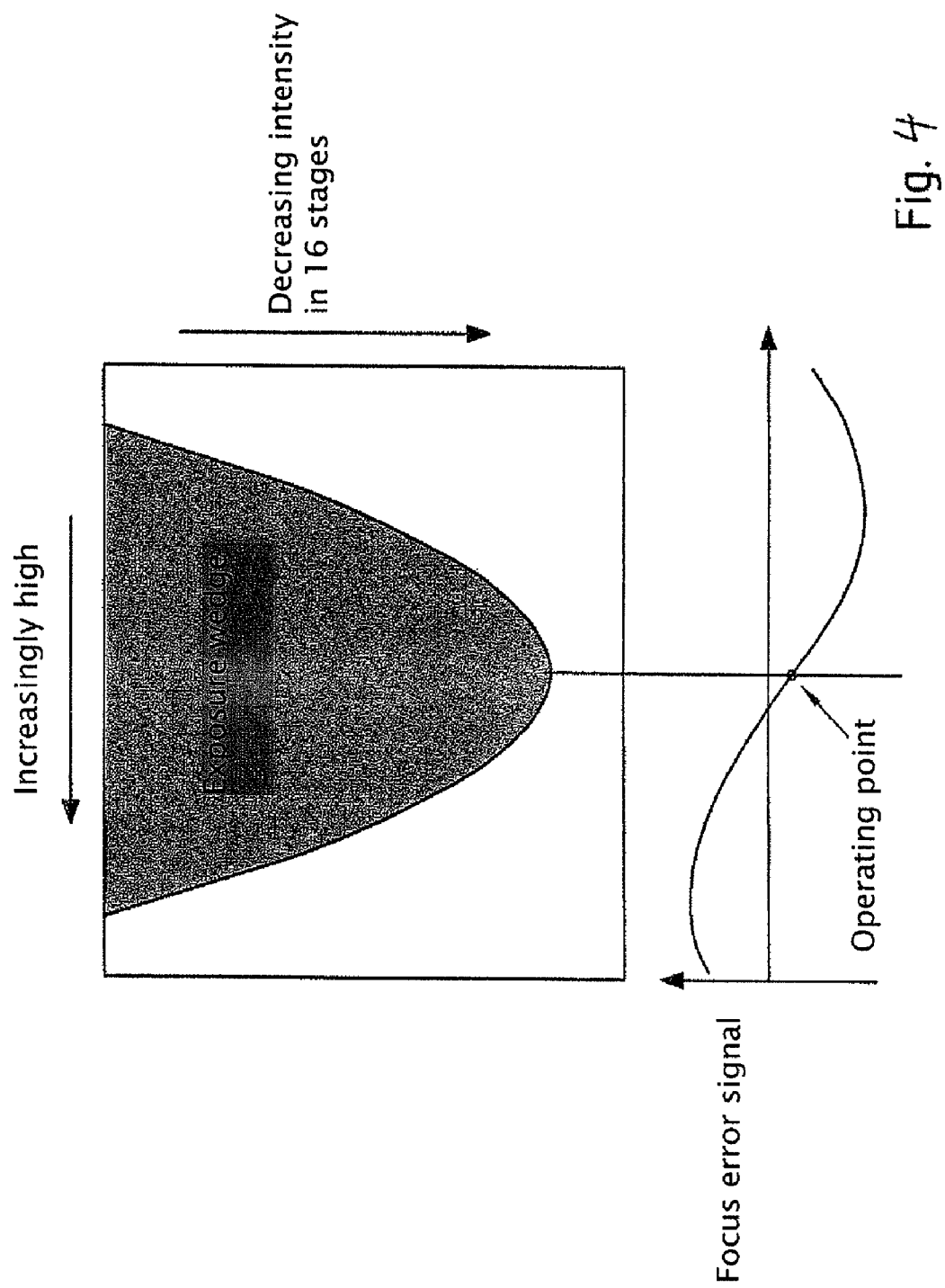
FIG. 4 shows a schematic illustration of an exposure wedge for determining the focus error and determining the operating point.

The method for determining the operating point is based on producing an exposure wedge. In this respect reference is made to FIG. 4. In this exemplary embodiment, a region of the material is structured in which along one axis the intensity and along the other axis the exposure height are altered continuously. A value range of 16 different gray shades is preferably used for the intensity. The height is varied over that region of the S curve (about 20 µm) which was defined beforehand in the adjustment of the S curve. A microscopic analysis of the exposed region leads to a wedge, see FIG. 4. The optimum exposure height is assumed where structuring still occurs in conjunction with very low intensity. Since the exposure height does not have a fixed relationship with the drive voltage of the actuator on account of the hysteresis, the focus error signal (FES) is preferably used as a reference for an optimum exposure. The FES voltage is therefore the operating point of the height regulation.

In order to be able to relate the exposure wedge to the focus error signal, it is necessary to rapidly generate and store the S curve synchronously with the exposure timing. The exposure of the wedge should be effected at normal exposure speed in order to increase the meaningfulness for the later large-area exposure. The exposure of the gray-scale value wedge and the determination of the operating point result as follows:

Firstly, a region for the gray-scale value wedge is selected by means of the microscopy function in the camera branch of the device. This is done by zeroing a position counter in the drive electronics.

The exposure pattern of the gray-scale value wedge (16 gray-scale values) is loaded.

The transport table is set back by a defined position in order to have a run-up for the exposure operation.

The height regulation module is put into the gray-scale value wedge mode. This has the effect that the values of the S curve are stored in a memory in a manner triggered by the laser pulse. In this case, the memory can be situated either preferably in the height regulation module or alternatively in the drive electronics.

The exposure of the gray-scale value wedge is preferably effected by means of 16 gray-scale value or intensity and 128 height steps, where the numerical values mentioned should be understood by way of example and are only preferred. In this exemplary embodiment, the drive voltage of the piezo actuator of the height adjustment of the microscope objective is altered in the ranges defined beforehand. The range restriction is effected during the adjustment of the height of the S curve by user intervention. At the same time as the exposure and the changing of the piezo-voltage, the value of the S curve is determined and stored.

The microscopy mode of the device is activated after the exposure. In this mode, the tip of the exposure wedge is brought to the center of the camera image or target mark by the movement of the linear table. Here the current position of the transport table is read out from the drive electronics. The stored S curve data are likewise read out. That S curve value at which an optimum exposure occurs can be read out on the basis of the current position in the read-out S curve data. This value is the operating point of the height regulation.

A one-point height regulation or a bidirectional writing requires an illumination or detection point on either side of the exposure lines, i.e. of the focused writing beam, since the detection functions effectively and in a manner free of disturbances only in the unstructured storage medium. This situation is illustrated in FIG. 5, wherein the exposure line is illustrated as a box pattern and the two illumination points are illustrated as circles.

In accordance with the direction of movement, only one of the two illumination points and the respectively assigned 4-quadrant detector are used for the evaluation. Through the distance between the exposure line and the detection point, the system looks into the future or the system can compensate for the reaction time of the electronics and of the actuator. Preferably, the detection points are situated in the center of the exposure line, but it is also possible to choose any other position if this is advantageous.

Figure 5:
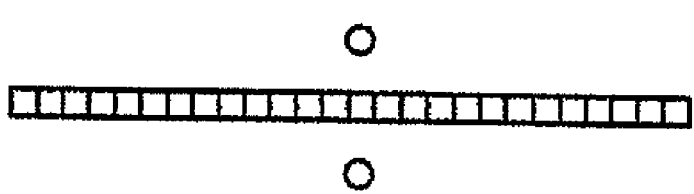
FIG. 5 shows a schematic illustration for elucidating a one-point height regulation.

However, by the arrangement shown in FIG. 5 with one detection point on either side of the illumination line, in a direction of movement, no tilting of the storage material along the exposure line can be detected and thus compensated for. This system relies on the storage material and the focus region (depth of field) of the exposure beam being parallel. A height regulation can be effected only transversely with respect to the orientation of the exposure line.

Figure 6:
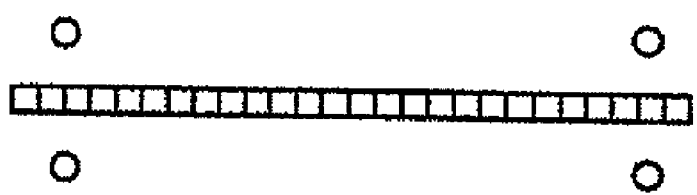
FIG. 6 shows a schematic illustration for elucidating a two-point height regulation.

The construction of the two-point height regulation is illustrated in FIG. 6 and is similar to the one-point height regulation described above. In order to be able to detect a tilting between the exposure line and the storage medium along the exposure line, instead of one detection point or scanning point, two detection points or scanning points are used for each direction of movement. If the detection points are arranged as in FIG. 6, then a tilting can be detected. The advantage of this system, moreover, is that independent height regulations can be used for each detection point. One detection point, e.g. the respective upper detection point in FIG. 6, can be incorporated in a closed height regulation loop with the piezo actuator at the microscope objective, wherein the other detection point, e.g. the respective lower detection point in FIG. 6, can act in a regulating loop with a tilting mechanism, e.g. at the fixing of the line light modulator.

It is thereby possible to use customary linear standard regulators, for example a PID regulator.

The tilting component can be separated from the z component electronically by a coordinate transformation and can then be passed to the respective actuator control loops.

Figure 7:
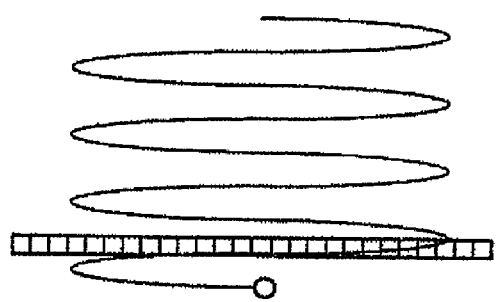
FIG. 7 shows a schematic illustration for elucidating a scanning height regulation.

A further preferred alternative to the previous systems and methods for detecting the position of the storage layer with one or two fixed detection points is a system which operates with a scanning detection point and thus realizes a scanning height regulation. The principle of the scanning height regulation is illustrated in FIG. 7.

At a specific distance from the exposure line, a detection point is scanned along the exposure line or perpendicular to the direction of movement, whereby a substantially sinusoidal waveform is produced, for example. In combination with the movement of the exposure line and of the detection point relative to the storage material, the material is thereby areally exposed and simultaneously scanned.

By the astigmatism method described above, the detection point obtains information about the height profile of the storage material before the exposure line. This information is composed of the error signal including the voltage of the piezo actuator of the microscope objective. If the two items of information are combined with the driving or current position of the detection point, then a height profile is obtained. The goal of a regulation is then to minimize the integral of the focus error by the regulation firstly adapting the piezo actuator of the microscope objective and secondly adjusting the actuator for the tilting of the exposure line relative to the storage material.

The advantage of this solution is that a height profile can be recorded over the entire writing region or at least part of the writing region. An ideal setting of the height and tilting is possible as a result. Errors, on account of dirt particles at the detection point, can be detected as such and delimited. Furthermore, a curvature of the storage material that is not detected in the case of a two-point detection can be taken into consideration. Moreover, it is possible to create a height profile of the storage medium for quality assurance tasks.

However, the evaluation of the height profile and the driving of the actuators are more complex and consequently require a higher computational complexity.

Figure 8:
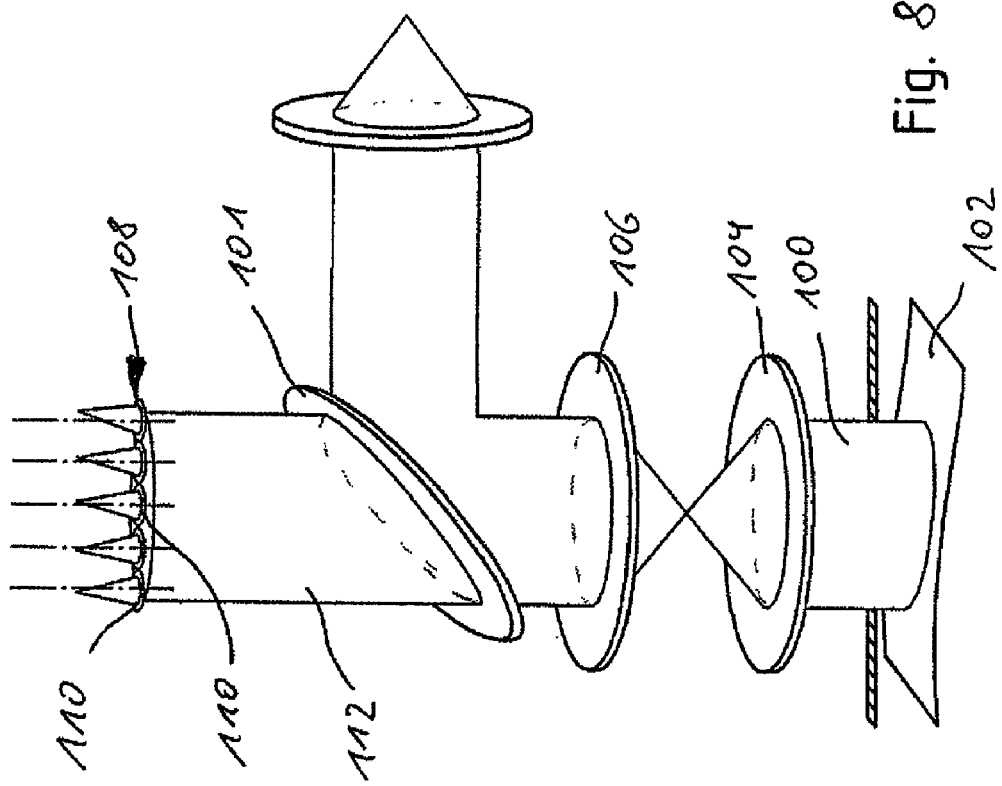
FIG. 8 shows a schematic illustration for elucidating a height regulation on the basis of a wavefront sensor.

A further preferred configuration of the height regulation consists in a wavefront height regulation, for which purpose, for the height regulation or detection of the storage surface, it is possible to use a system that operates similarly to a wavefront sensor, as is illustrated in FIG. 8.

A collimated laser beam 100 impinges on a storage medium 102 after deflection by a beam splitter 101. The reflected-back wave is directed onto a one-dimensional lens array 108, which preferably has cylindrical lenses 110, via an intermediate focus produced by the lens pair 104, 106. On account of the Fourier transformation property of the lenses 110, the position of the focus is dependent on the angle of the incident beam 112 and thus on the tilting of the surface of the storage medium 102.

The shift of each focus of the individual lenses 110 can be used for the detection of the position and orientation of the surface of the storage medium 102. Moreover, this method affords a possibility for obtaining areal information about the surface of the storage medium 102.

If, instead of a one-dimensional lens array 108, a two-dimensional lens array with a two-dimensional detector, preferably a camera chip, is employed, then it is possible to drive the actuators in anticipatory fashion for height and tilting of the storage medium relative to the objective, for example the objective 36 in FIG. 1.

However, this type of height measure requires an additional absolute height measurement at least one point since the system described above obtains only gradients of the height rather than absolute values.

Figure 9:
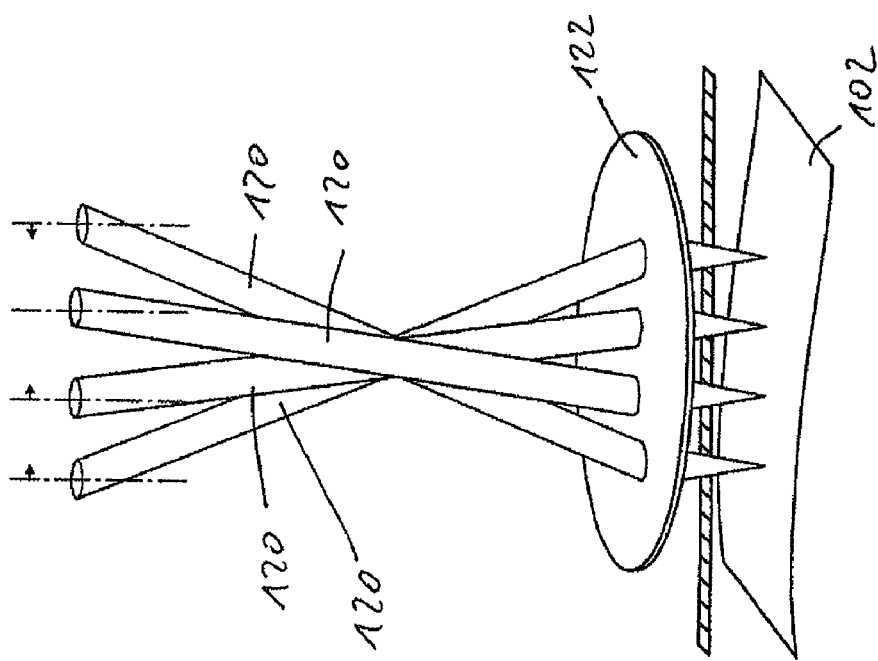
FIG. 9 shows a schematic illustration for elucidating a height regulation on the basis of a simple wavefront sensor.

In a further preferred alternative it is possible to realize a simple wavefront sensor with the construction shown in FIG. 9. In this exemplary embodiment, a plurality of sample beams 120 are directed at different angles onto the schematically illustrated microscope objective 122, which may correspond for example to the objective 36 in FIG. 1, and the storage medium 102.

As a result of a tilting or deformation of the storage medium 102, each sample beam 120 experiences its own offset, which is illustrated by small arrows at the top in FIG. 9. An areal sensor (camera chip) can determine the offset with respect to a reference position by centroid calculation of the measured intensity distribution, from which offset in turn the gradient of the surface of the storage medium 102 can be deduced. An absolute height determination at one point is once again necessary here.

Figure 10:
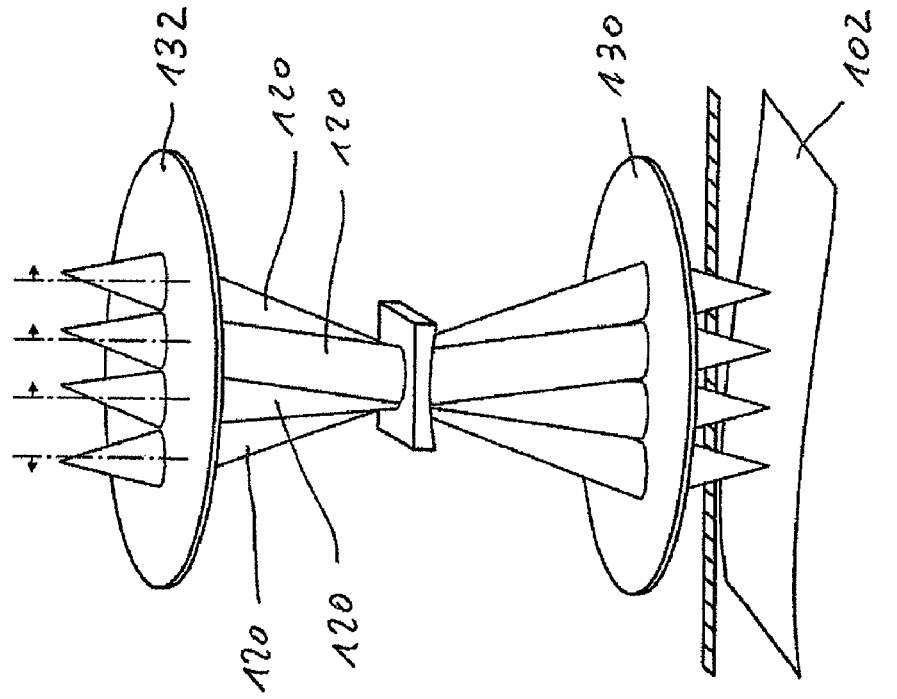
FIG. 10 shows a schematic illustration for elucidating a height regulation on the basis of a position-dependent phase shift.

A further preferred exemplary embodiment obtains the height information by means of a position-dependent phase shift. This system is illustrated schematically in FIG. 10 and operates with a plurality of sample beams 120 in the same way as previously described. A deformation of the reflection plane, i.e. of the surface of the storage medium 102, produces a translation in the Fourier plane. In this exemplary embodiment, the Fourier transformation is produced by two focusing lenses 130 and 132. If an optical element 134 that alters the phase depending on the position, for example a spherical or alternatively an aspherical lens or a cylindrical lens, is introduced in the Fourier plane between the two lens, then this results in a shift in the foci in the focal plane of the second lens 132. By way of the shift in the foci, the deformation of the surfaces of the storage medium 102 can then in turn be deduced. As in the systems described above, an absolute measurement of the heights at one point is necessary here, too.

A multiplicity of possible and unavoidable inadequacies in the optical, mechanical and electrical construction can be compensated for by a calibration of the light modulator 6. The preferred line light modulator 6 is generally mentioned without wishing to exclude a two-dimensional modulator.

In an exemplary embodiment, each individual pixel is measured. The measurement result is stored for each pixel separately in a table in a computer. This table is used to calculate a look-up table, which is stored in the drive electronics of the line light modulator 6. The central element is a CMOS camera or some other suitable camera system which is used for the local intensity measurement. By an upstream image processing, a region around the focus of an imaged pixel of the line light modulator is identified which is subsequently used for the intensity determination. This ensures that no artifacts such as light reflections are taken into account in the measurement. Moreover, a fine adjustment of a photodiode that is usually used for such measurements is obviated.

Furthermore, the use of a CMOS camera permits the position detection of the current focus. If the latter migrates from a central region, then a directed repositioning can be effected by means of the transport table.

A further method for determining the intensity of an individual pixel of the line light modulator is based on the use of a small aperture, preferably having a diameter of about 10 µm, under which a photodetector is positioned, and an X-Y positioning device. By means of the X-Y positioning device in the writing plane (plane of the storage material), the pin hole, i.e. the small aperture, is positioned centrally with respect to a writing point to be examined. The intensity of the impinging writing beam is measured by means of the photodiode and an evaluation electronic unit, which preferably operates logarithmetically.

The calibration specified above is effected in a relatively complicated manner and compensates for inaccuracies and temporal fluctuations in the illumination of the line light modulator 6.

The following functions are provided in the calibration:
submicron measurement of the writing focus
correlation to a pixel of the line light modulator
measurement of the transfer function
deviation of uniform intensity steps over all pixels
storage in a look-up table
correction of the driving of the line light modulator during the running time
on-line monitoring and calibration of the correction of the line light modulator or illumination optical unit
feedback of the exposure quality (holographic and pattern based quality) and on-line calibration of the exposure.

During scanning operation, in connection with the construction described in FIG. 1 and the writing path achieved therewith, it is assumed that the exposure line is fixed relative to the objective or to the device, in particular to the objective 36. By introducing an actuator e.g. for moving the beam splitter 38 "dichroic beam splitter", it is possible to move the exposure line relative to the objective 36.

If a movement of the exposure line in the direction of the material transport is realized, it is thereby possible to compensate for a jitter brought about, inter alia, by a speed fluctuation of the transport table 12.

If a movement transversely with respect to the material transport is realized, this degree of freedom permits compensation of faults or inaccuracies in the material guidance. Inter alia, in the case of an areal exposure composed of a plurality of exposure lines, it is necessary for the exposure lines to be placed against one another in a controlled manner; in this respect, see the description of FIG. 3 presented above. By a detection of the preceding exposure, it is possible for the tracks to be placed exactly against one another by means of the scanning device.

Likewise by a movement of the exposure line transversely with respect to the direction of movement of the storage medium 2, the exposure can be effected at a position predefined in the material of the storage medium 2. This in turn presupposes a detection of the predefined position, for example by an embossed track.

A detailed explanation is given below of preferred writing strategies or exposure strategies in the application of a device for microstructuring which concern a control of the intensity during the writing operation. However, the exposure strategy is not dependent on the precise configuration of the device as described above, but rather relates to all exposure operations in which microstructures are introduced into a storage medium line by line or areally.

Preferably, for this purpose use is made of a control system for correcting the proximity effects during the running time together with an algorithm comprising a splitting of the line profile into a portioned component and into a differential component. The correction depth can be set depending on parameters which can be chosen in a variable manner and which can be material-specific, inter alia.

In an exemplary embodiment, a specific pulse strategy is used as a degree of freedom in the material structuring, which can preferably be set electronically, in particular in a manner dependent on whether the exposure line is oriented orthogonally or obliquely with respect to the direction of movement.

In an exemplary embodiment, the degree of structuring of individual exposure points in a scanned pattern, i.e. for example the intensity of the conversion—effected by the exposure—of the optical property of the material of the storage medium, is intended to be independent of the structuring or exposure of the surroundings.

In order to meet this requirement, so-called proximity effects can be taken into consideration in the driving of the pixels and thus in the choice of exposure intensity. Two different effects have to be assumed here in the lithographic device described above. Firstly, within an exposure line, intensity increases occur in the case of points placed alongside one another in comparison with an individual placed point; secondly, on account of heat propagation, different material properties occur depending on whether a point was placed in the vicinity shortly beforehand (microsecond). In other words, proximity effects are to be taken into account not only in the direction of the exposure line, but also in the writing direction. This second effect of temporal proximity is less dominant at low writing speeds and can generally be disregarded.

The effect of the different placement of the storage points can be compensated for by a preprocessing of the data to be written.

Figure 11:
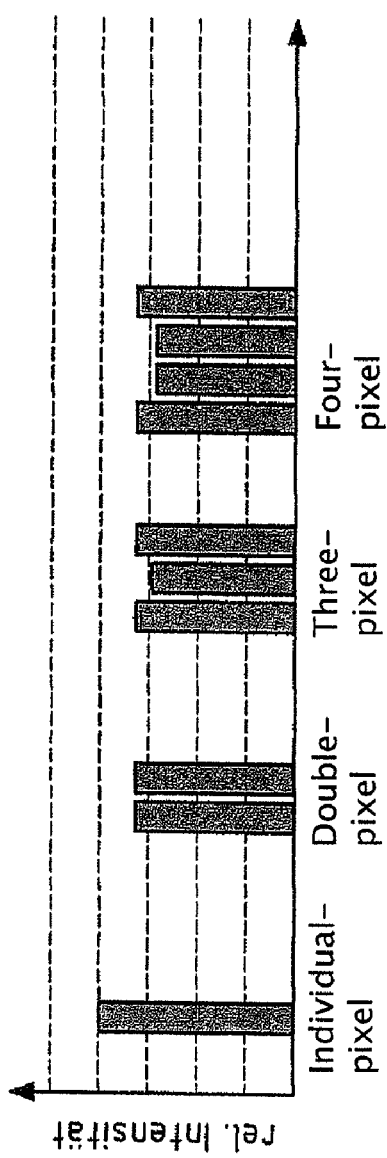
FIG. 11 shows a schematic illustration for elucidating a first writing strategy.

FIG. 11 illustrates an example of an exposure strategy which takes a preprocessing as a basis. The individual pixel is ascribed the maximum energy for formation. By means of the gray-scale value option of driving, in the case of a double pixel the intensity of the two adjacent pixels is reduced. In the case of three adjacent pixels, the intensity is reduced further in the case of the central pixel. In the case of further adjacent exposure points, the central pixels are exposed with identical intensity.

As a result, exposure points are fashioned largely identically. Under certain circumstances, the third intensity reduction can be dispensed with. The writing strategy described can be employed both within an exposure line and from exposure line to exposure line. In this exemplary embodiment, it can furthermore be taken into account that the individual pixels in an exposure line are written simultaneously and that adjacent pixels from different exposure lines are written in a temporally offset manner. An exposure strategy from line to line can be obviated, however, depending on the material properties.

A further preferred exposure strategy consists in writing separate pixels which have no direct neighbors. For this purpose, an exposure pattern with isolated exposure points is preferably written in, wherein one pixel of a pair of possible exposure points is in each case activated during a desired exposure, while the other pixel remains blanked. This ensures that each pixel is surrounded by a non-exposed region.

In order to compensate for the pitch spacing that increases as a result, it is possible to achieve a double reduction by replacing the objective. Computer-generated holograms that are exposed according to this method exhibit a smaller edge roll-off in the reconstruction. This is because the smaller the written dots are in relation to the entire structure, the larger is the region having sufficiently high intensity in the reconstruction of the hologram. The region that decreases in intensity toward the edge lies further outward and thus leads to improvement of the quality of hologram.

Figure 12:
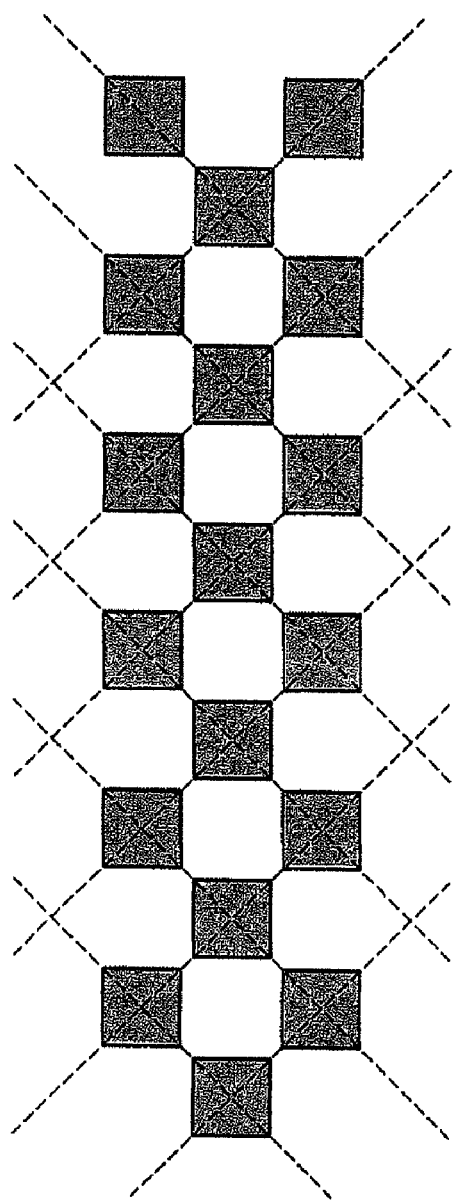
FIG. 12 shows a schematic illustration for elucidating a second writing strategy.

A pitch spacing that is larger only by the factor $\sqrt{2}$ is obtained if the orientation of the line light modulator is tilted with respect to the direction of movement. This is achieved by changing the active pixel of a pairing from line to line; in this respect, see FIG. 12.

The invention claimed is:

1. A device for microstructuring a storage medium, comprising:
    a radiation source for generating an at least partially coherent beam of electromagnetic radiation,
    a modulator having a plurality of individually switchable modulator elements,
    a beam shaping optical unit for illuminating the modulator,
    a reducing optical unit for reducing a beam emitted by the modulator,
    an arrangement for converting a phase modulation into an intensity modulation, and
    a transport device for moving the storage medium relative to the reducing optical unit,
wherein
    the reducing optical unit is formed in diffraction-limited fashion,
    the reducing optical unit produces an area reduction of at least 25 proceeding from an area of the individually switchable modulator elements,
    the transport device is formed as a transport table, and
    a controller is provided the controller synchronizes the radiation source, the modulator and the transport table, and
wherein
    means are provided for generating a master trigger $T_0$ for a predetermined time duration $\Delta T$ before a position of a new structuring to be written in the storage medium during a movement of the transport table,
    means are provided for driving the radiation source in order to generate a pulse at an instant $T_0+\Delta T$,
    means are provided for setting the modulator in accordance with an information to be written, before the instant $T_0+\Delta T$ is reached, and
    means are provided for generating at the instant $T_0+\Delta T$ a radiation pulse via radiation source.

2. The device as claimed in claim 1, wherein the area reduction of the reducing optical unit is between 25 and 1000.

3. The device as claimed in claim 1,
    wherein the reducing optical unit reduces a radiation intensity diffracted by each modulator element to a size of less than 10 µm diameter.

4. The device as claimed in claim 1, wherein the radiation source is formed as a laser.

5. The device as claimed in claim 4, wherein the laser generates a monomode laser beam.

6. The device as claimed in claim 4, wherein the laser generates a multimode laser beam having partial coherence.

7. The device as claimed in claim 1, wherein the modulator is a single-line light modulator comprising individually switchable modulator elements.

8. The device as claimed in claim 1, wherein the modulator is a two-dimensional light modulator comprising individually switchable modulator elements.

9. The device as claimed in claim 1, wherein the beam shaping optical unit is formed in diffraction-limited fashion.

10. The device as claimed in claim 1, wherein the beam shaping optical unit generates a beam profile adapted to an area of the modulator from a beam profile generated by the radiation source.

11. The device as claimed in claim 10, wherein the beam shaping optical unit has a Powell lens.

12. The device as claimed in claim 1, wherein the reducing optical unit has a microscope objective.

13. The device as claimed in claim 1, wherein the reducing optical unit has at least two objectives having a different focal length and/or numerical aperture.

14. The device as claimed in claim 1, wherein the reducing optical unit has a spatial frequency filter in or near a Fourier plane.

15. The device as claimed in claim 1, wherein the transport table is adjustable in at least one axis.

16. The device as claimed in claim 1, wherein the transport device moves the storage medium in a direction of the reducing optical unit.

17. The device as claimed in claim 1, wherein a movable optical element is provided in a beam path upstream of the reducing optical unit for a purpose of shifting a reduced intensity pattern on the storage medium.

18. The device as claimed in claim 1, further comprising a camera system for monitoring the microstructuring or for monitoring a predetermined orientation or an alignment relative to a predetermined or already written microstructuring or marking.

19. The device as claimed in claim 1, further comprising an autofocusing system for adapting a distance of the storage medium from the reducing optical unit.

20. A method for controlling a device for microstructuring a storage medium, wherein during a movement of a transport table, a master trigger $T_0$ is generated for a predetermined time duration $\Delta T$ before a position of a new structuring to be written in the storage medium is reached, a radiation source is driven in order to generate a radiation pulse at an instant $T_0+\Delta T$, a modulator is set in accordance with an information to be written, before the instant $T_0+\Delta T$ is reached, and the radiation source generates, at the instant $T_0+\Delta T$, a radiation pulse whose intensity distribution is varied in accordance with a setting of the modulator.

21. The method as claimed in claim 20, wherein the transport table is moved continuously, and wherein the master triggers $T_0$ are generated by the movement of the transport table by a predetermined distance in each incidence.

\* \* \* \* \*